United States Patent [19]

Carver

[11] 4,249,125
[45] Feb. 3, 1981

[54] PORTABLE DEVICE FOR TESTING AND/OR TEMPORARILY CORRECTING CIRCUITS IN A VEHICLE ELECTRICAL SYSTEM

[76] Inventor: Clem Carver, P.O. Box 4,, Blackwell, Okla. 74631

[21] Appl. No.: 931,167

[22] Filed: Aug. 4, 1978

[51] Int. Cl.³ .................... G01R 31/02; H01R 3/00
[52] U.S. Cl. .................................. 324/51; 339/10; 339/19; 339/113 L
[58] Field of Search ................ 339/18 C, 19, 195 R, 339/195 M, 31 R, 222, 10, 14 R, 14 P, 113 L, 196 R, 196 M; 324/51, 53

[56] References Cited

U.S. PATENT DOCUMENTS

| 2,705,773 | 4/1955 | Ward | 324/51 X |
| 3,210,720 | 10/1965 | Harris | 339/31 R |
| 3,345,599 | 10/1967 | Henschen et al. | 339/18 C |
| 3,428,888 | 2/1969 | Nolte | 324/51 |
| 3,493,915 | 2/1970 | Cox | 339/19 X |
| 3,663,923 | 5/1972 | Primoff et al. | 339/222 X |
| 3,663,939 | 5/1972 | Olsson | 324/51 X |
| 3,831,129 | 8/1974 | Frey | 339/19 |
| 3,836,843 | 9/1974 | Yonce | 324/51 |
| 3,836,844 | 9/1974 | Prugh | 324/51 |
| 3,924,914 | 12/1975 | Banner | 324/51 UX |
| 4,021,732 | 5/1977 | Metcalf | 324/53 |
| 4,166,242 | 8/1979 | Spiteri | 324/51 |

FOREIGN PATENT DOCUMENTS

| 728300 | 2/1966 | Canada | 324/51 |
| 445120 | 6/1912 | France | 339/195 R |

*Primary Examiner*—Gerard R. Strecker
*Attorney, Agent, or Firm*—Eugene M. Eckelman

[57] ABSTRACT

A body member has a number of electrically conducting inlet-outlet connectors or contacts arranged for plug-in attachment with junction portions of a vehicle electrical system having individual power circuits and associated light circuits. A separate visual indicator, such as a light emitting diode, is associated with each inlet-outlet connector. The body member includes a ground circuit therein whereby circuits to the indicators are completed without an outside ground. At least one of the inlet-outlet connectors has a removable portion whereby upon removal thereof, one or more light circuits can be isolated from its power source if desired. As a further concept of the invention, the device is arranged to receive one or more detachable jumpers to provide power from a functioning power circuit to a circuit that has lost its power.

4 Claims, 7 Drawing Figures

U.S. Patent      Feb. 3, 1981      4,249,125
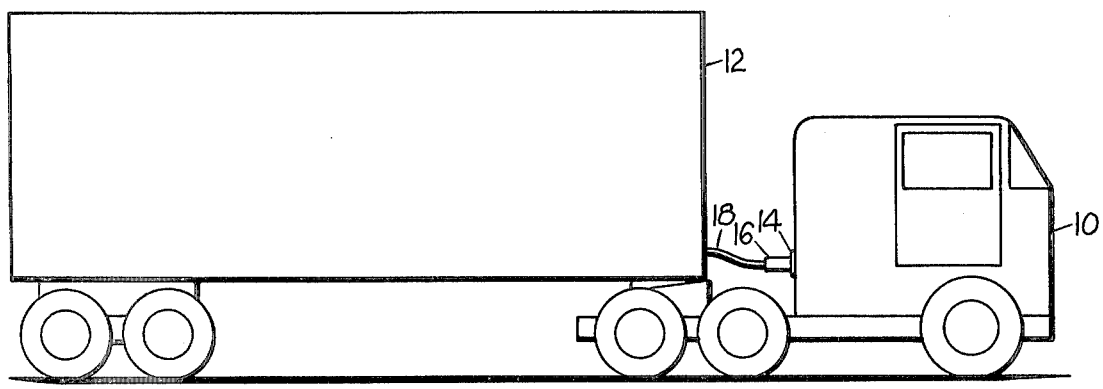
FIG. 1
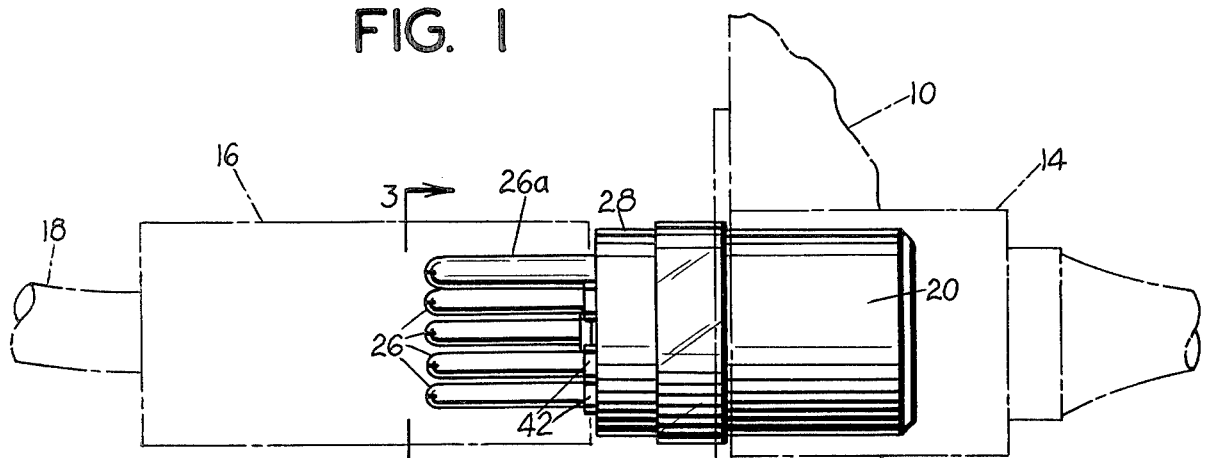
FIG. 2
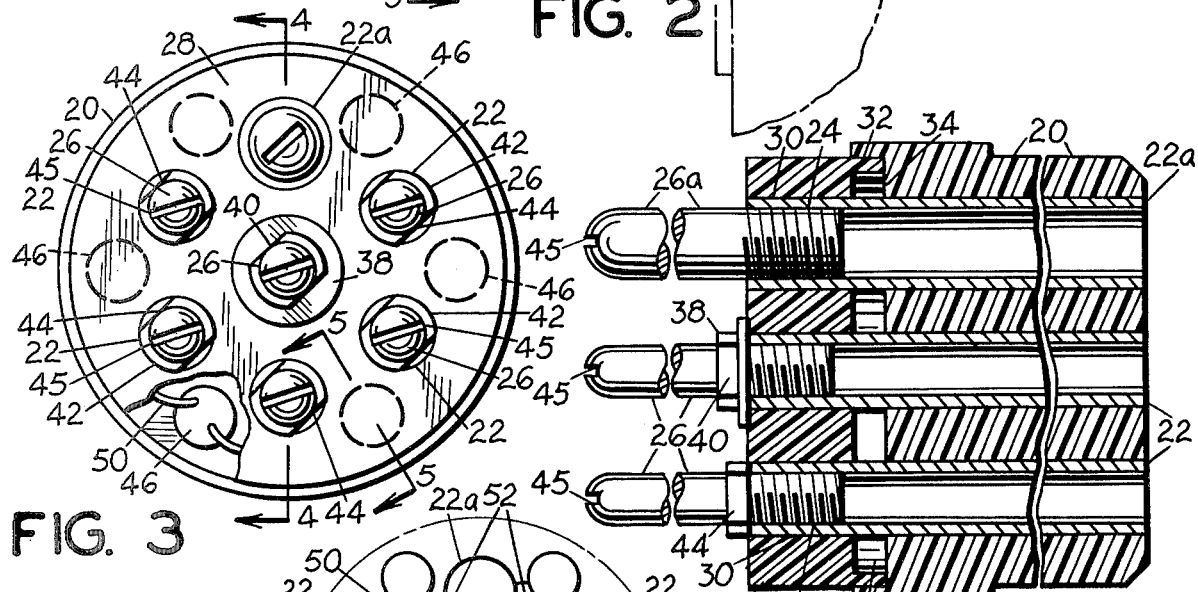
FIG. 3
FIG. 4
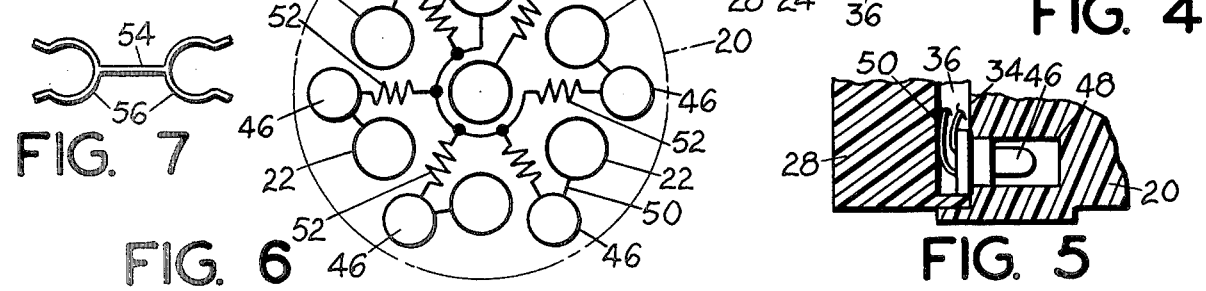
FIG. 7
FIG. 6
FIG. 5

PORTABLE DEVICE FOR TESTING AND/OR TEMPORARILY CORRECTING CIRCUITS IN A VEHICLE ELECTRICAL SYSTEM

BACKGROUND OF THE INVENTION

This invention relates to a new and useful device for testing and/or temporarily correcting circuits in a vehicle electrical system.

It is customary in the larger type road vehicles such as truck and trailer assemblies, recreational vehicles, and the like, to utilize a junction on the pulling vehicle arranged for plug-in connection with a cord containing wires leading to the lights on the trailing vehicle, each of the circuits in the trailing vehicle being associated with a power circuit from the pulling vehicle extending through the junction.

When the vehicle is on the road, it is extremely inconvenient and sometimes dangerous to the driver, as well as to other vehicles on the highway, when short circuits develop in the circuits. In such a case, circuit breakers will generally open, causing an entire circuit of lights to become ineffective and making it impossible or difficult for the vehicle to proceed. If the driver re-sets the circuit breakers while a short circuit still exists, there may be danger of overheating of circuit wires and a resulting fire. To find the source of trouble, the driver must operate the various actuating switches which control the light circuits and walk around to determine the defective circuit. If he is alone, it is generally impossible to find a short circuit since if the circuit breaker is closed it will again open before the driver can get around to the side or back of the vehicle.

The above problems and others have been recognized in the trade and devices for testing circuits have heretofore been devised in an attempt to overcome them. One such device is shown in U.S. Pat. No. 3,836,843 and employs a plug-in body member having a plurality of lamps which indicate a defective power circuit from the pulling vehicle when a suitable ground is established between a metal handle on the device and the body of the vehicle. This testing device has several disadvantages one of which is that the operator must establish a ground on the vehicle and another of which is that the device is merely a tester and does not provide any help for the driver to correct the problem at least to the extent which will allow him to proceed to a repair station.

SUMMARY OF THE INVENTION

According to the present invention and forming a primary objective thereof, a device is provided which constitutes an improvement over prior structures in that in addition to having structure for testing vehicle circuits to show defective circuits it also has structure which can accomplish temporary correction of certain parts of the circuit so that in most instances the driver can at least proceed to a repair station.

Another object is to provide a device of the type described employing inlet and outlet connectors which facilitate plug-in connection of the device at outlet junctions of power circuits between the pulling vehicle and a trailing vehicle or between two trailing vehicles whereby said temporary correction of one or more circuits can be made. The present device includes a ground circuit operative with a ground from the pulling vehicle so that the operator is not required to establish an outside ground.

Another object of the invention is to provide a device of the type described which is simple in structure and relatively inexpensive to manufacture and which also is compact in size so that it can be readily stored in the vehicle and ready to use.

In carrying out the above objectives, the device includes a body member having a plurality of electrically conducting inlet-outlet connectors arranged to be releasably plugged into junction portions of vehicle electric circuits. Visual indicators, preferably comprising light emitting diodes, are housed in the body member and connected into the circuits of the inlet-outlet connectors, and upon plugging the body member into the vehicle lighting system junction, the condition of each circuit can be determined by a visual inspection of the indicators, the body member including a ground circuit therein arranged for connection to the ground portion of the circuit from the pulling vehicle so that it is not necessary to establish an outside ground. The inlet-outlet connectors have a removable portion which upon removal thereof is arranged to isolate its circuit from the power source in the event of a short. In addition, the inlet-outlet connectors are arranged releasably to receive jumper means for transferring power from one of the connectors to another such as when one of the inlet-outlet connectors has lost its power.

The invention will be better understood and additional objects and advantages will become apparent from the following description taken in connection with the accompanying drawings.

BRIEF DESCRIPTION OF THE DRAWINGS

FIG. 1 is a side elevational view of a vehicle assembly of a type with which the present invention may be used;

FIG. 2 is an elevational view of the present device and showing in broken lines conventional junction portions of a vehicle electrical system;

FIG. 3 is an end elevational view of the device taken on the line 3—3 of FIG. 2;

FIG. 4 is a foreshortened sectional view taken on the line 4—4 of FIG. 3;

FIG. 5 is a sectional view showing a detail of indicating means associated with the device, this view being taken on the line 5—5 of FIG. 3;

FIG. 6 is a diagrammatic view showing circuitry for indicating means in the device; and FIG. 7 is a plan view of jumper means arranged to be used with the present device in certain instances.

DETAILED DESCRIPTION OF A PREFERRED EMBODIMENT

With reference to the drawings, FIG. 1 shows a vehicle assembly with which the present invention may be used for testing and temporarily correcting light circuits. Such vehicle assembly comprises a pulling vehicle or tractor 10 and a trailing vehicle 12 such as a trailer. The electrical system for operating lights on the trailer generally includes a junction portion 14 on the vehicle, also seen in FIG. 2, having a plurality of male contacts, not shown, and a plug-in female type junction 16 associated therewith which is mounted on the end of a cord 18 extending from the pulling vehicle to the trailing vehicle, the rearward end of the cord 18 also generally including plug-in junction portions, not shown, arranged to provide releasable connection of the cord with the trailer. In addition, where tandem trailers are pulled, similar junctions and cords are provided between trailers, and the invention has similar use at these junction points.

The device of the present invention comprises a body member 20, FIGS. 2 through 5, having a plurality of connector portions 22 in the form of end opening sleeves or sockets secured or molded therein and formed of electrically conducting material such as metal. These sleeves are selectively arranged for plug-in engagement with the male contacts of the junction portion 14. The contacts of the junction 14 are associated with power circuits and a ground circuit from the pulling vehicle, the body member 20 having a sleeve 22a for plug-in connection with such ground contact in junction 14. Sleeves 22 and 22a are electrically insulated from each other and for this purpose the body member may for example be molded from an electrically non-conductive material. One of the male contacts in junction portion 14, such as the center one, is connected to an auxiliary power circuit and the center sleeve 22 will thus likewise comprise an auxiliary power source.

The ends of sleeves 22 opposite from the plug-in ends have internally threaded end portions 24 which project from the body member and which receive threaded ends of male contacts or connectors 26 at these ends, one of such contacts comprising a ground contact 26a for connection to sleeve 22a. The projecting ends 24 of the sleeves are arranged to be covered by a removable cap 28 having apertures 30 therethrough for receiving such sleeves. The inner or forward end of cap 28 has a longitudinally projecting peripheral flange 32 arranged for end engagement in an inset or recessed portion 34 of body member 20, the flange 32 providing a space 36 between the cap and body member. One of the male contacts 26, such as the center contact, has an integral head 38 spaced a short distance from the inner end of the contact and arranged for abutment against the end of cap 30 when the contact is threaded into place. This head holds the cap in place and thus it is apparent that the contact which has this head must be removed before the cap can be taken off. Head 38 has side notches 40 for engagement by a wrench for installing and removing the contact. The other contacts 26 also have heads 42 spaced a short distance from their inner ends, these heads also having wrench engaging side notches 44. The latter heads are slightly smaller than the diameter of holes 30 whereby the cap can be removed with all the male contacts in place except for the contact with head 38. The outer ends of the contacts have slots 45 so that such contacts can be installed and removed by a screw driver instead of a wrench if desired.

An electrically actuated visual indicator 46 is provided in the body member 20 for each of the connectors 22. These indicators preferably comprise light emitting diodes for long lasting and rugged use and are fitted into recesses 48 in the inset end 34 of the body member. With reference to FIG. 6, each of these diodes has circuit wiring 50 between its associated connector portion 22 and ground portion 22a through a resistor 52, the wiring and resistors being contained in space 36. The body member 20 is molded of a material which is substantially transparent or translucent whereby to allow the indicators when energized to be visible at the exterior of the body member. The indicators are well protected within the body member and may be of a construction whereby to be used with either a positive or negative ground.

FIG. 7 shows a jumper 54 having opposite end sockets 56 one of which is arranged to engage a male contact 26 and the other of which is arranged to fit snugly within a sleeve 22. This jumper is constructed of an electrically conductive material and its purpose will become more apparent hereinafter.

In the operation of the present device, power circuits from the pulling vehicle at the junction 14, 16 can be tested by separating this junction and plugging the present device into junction 14. If all the indicators 46 are energized, it is apparent that all the power circuits are functioning. Such testing can be accomplished without the use of an outside ground in view of the ground contact in the body member which is connected to the ground circuit from the pulling vehicle. If a lighting circuit to the rear of the pulling vehicle is seen to be faulty by the driver, he can check the power circuit to that particular circuit. If such power circuit is functional, then the driver knows that the trouble is rearwardly of junction 14. He can also test the cord 18 by unplugging the present device from the junction 14, reconnecting junction portions 14 and 16, unplugging the rearward end of the cord from the trailer, and plugging the present device into this rearward end of the cord. The condition of the circuit up to the rearward end of the cord can thus be determined. This same procedure is used to check circuits in connecting cords between tandem trailers.

The device thus can be used to test circuits and if possible the driver can remedy the problem on the spot. However, in some situations, it may not be possible to make repairs on the road but to save time and prevent inconvenience to the driver he may want to proceed at least to a repair station rather than wait on the highway for a repairman. In this regard, the present device can be used, in addition to finding the fault, of providing a temporary repair or correction which will at least allow the driver to proceed. For example, in the event of a short circuit, the present device can be used to disable such a circuit. This is accomplished by removing the contact 26 which is in the faulty circuit and then installing the present device between junctions 14 and 16, leaving it plugged in until the driver has proceeded to a repair station. This procedure will disable only the faulty circuit and allow operation of all the other circuits.

Another function of the present device which may allow the driver to proceed is its capability of using the power from a functioning power circuit to energize a circuit that has lost power from the tractor. For this purpose, the jumper 54 shown in FIG. 7 is connected between the auxiliary connector 22 and the non-functioning connector 22, it merely being necessary to loosen the male contacts 26 slightly to allow the jumper to be placed under the heads 38 or 42 of the proper contacts and then tighten the contacts down on the jumper. Thus, if it is evident that the power to one of the connectors 22 has failed, power from the auxiliary connector can be used to energize the faulty circuit and the vehicle can proceed. In the event of a short in a power circuit to a connector 22, the jumper 54 is also used but the contact 26 of the shorted circuit is first removed. The jumper is in this case clamped with one end under the head 38 of the center auxiliary contact 26 and its other end fractionally fitted into the appropriate female socket of the cord connector.

According to the present invention, a test device is provided which can be used in the shop or on the road and oftentimes when used on the road can save the driver much time and inconvenience. In addition, the driver can isolate a circuit by removal of male contacts 26 or he can use a jumper 54 to power a circuit that has lost its power, all to the advantage that such may allow him to drive to a facility for repair and at the same time make conditions much safer and more convenient for him. The present device can also be used to trace circuits and assist in hookups in other situations as well such as when cords 18 are torn or otherwise damaged. It is to be understood that the form of my invention herein shown and described is to be taken as a preferred example of the same and that various changes in the shape, size and arrangement of parts may be resorted to without departing from the spirit of my invention or the scope of the subjoined claims.

Having thus described my invention, I claim:

1. A portable testing and circuit correcting device for insertion between a pair of releasable junction portions of a vehicle electrical system of a type having a plurality of individual power circuits operating through the junction portions for energizing light circuits of the vehicle, said device comprising:
   a. a body member having opposite ends;
   b. a plurality of longitudinally extending sockets provided in said body member with a segment of each socket projecting beyond an end of said body member;
   c. said sockets being defined by electrically conducting means arranged to have releasable plug-in engagement with one of the junction portions of the vehicle electrical system;
   d. a plurality of prongs of electrically conducting means connected to said sockets and projecting from the said end of said body member and arranged to have releasable plug-in engagement with the other of the junction portions of the vehicle electrical system;
   e. said end of said body member having recesses formed therein;
   f. visual electrical indicators positioned in said recesses;
   g. a removable cover positioned over said projecting segment of each socket, said cover having a peripheral flange engaging said end of said body member for retaining said visual indicators in said recesses;
   h. said sockets and respective prongs being arranged when plugged in between the releasable junction portions of a vehicle electrical system to be supported by the junction portions and to provide electrical connection between power circuits and light circuits of the vehicle; and
   i. said prongs being releasably attachable to said socket such that when removed one or more of said prongs are arranged to isolate selected light circuits of the vehicle from its power source with said visual indicators indicating the power condition in each circuit.

2. The apparatus of claim 1 including electrically conducting jumper means arranged to be releasably connected from one of said sockets or prongs to another of said sockets or prongs for supplying power from one of said sockets or prongs to another that has lost its power.

3. The apparatus of claim 1 wherein said indicating means comprise light emitting diodes.

4. The apparatus of claim 1 wherein one of said sockets and its associated prong are arranged to be releasably connected to a ground circuit from a junction portion of a vehicle electrical system, and means electrically connecting said other sockets and prong to the grounded socket and prong.

* * * * *